(12) United States Patent
Espin et al.

(10) Patent No.: US 11,605,575 B2
(45) Date of Patent: Mar. 14, 2023

(54) MOUNTING DEVICES FOR SEMICONDUCTOR PACKAGES WITH A FIXATION MECHANISM

(71) Applicant: Mahle International GmbH, Stuttgart (DE)

(72) Inventors: Francisco Gonzalez Espin, Elche (ES); Torbjorn Hallberg, Valencia (ES); Jose Antonio Castillo, San Antonio de Benageber (ES)

(73) Assignee: Mahle International GmbH

( * ) Notice: Subject to any disclaimer, the term of this patent is extended or adjusted under 35 U.S.C. 154(b) by 99 days.

(21) Appl. No.: 16/812,260

(22) Filed: Mar. 6, 2020

(65) Prior Publication Data
US 2020/0286810 A1    Sep. 10, 2020

(30) Foreign Application Priority Data
Mar. 8, 2019 (EP) .................................... 19382173

(51) Int. Cl.
*H01L 23/40* (2006.01)
*H01L 23/34* (2006.01)

(52) U.S. Cl.
CPC .......... *H01L 23/4006* (2013.01); *H01L 23/34* (2013.01); *H01L 2023/4031* (2013.01); *H01L 2023/4062* (2013.01); *H01L 2023/4087* (2013.01); *H05K 2201/10* (2013.01); *H05K 2201/10598* (2013.01)

(58) Field of Classification Search
CPC .............. H01L 23/49811; H01L 23/32; H01L 23/34–4735; H01L 23/12–15; H01L 31/024; H01L 31/052–0525; H01L 33/64–648; H01L 21/4871–4882; H01L 21/4885; H05K 2201/10–10992
See application file for complete search history.

(56) References Cited

U.S. PATENT DOCUMENTS

2017/0150640 A1    5/2017   Yamanaka et al.

FOREIGN PATENT DOCUMENTS

| EP | 2667693 A2 | 11/2013 |
| JP | H0444190 A | 2/1992 |
| JP | 2010251487 A | 11/2010 |

OTHER PUBLICATIONS

English abstract for JP-2010251487.
English abstract for JP-H0444190.

*Primary Examiner* — Steven B Gauthier
*Assistant Examiner* — Candice Chan
(74) *Attorney, Agent, or Firm* — Fishman Stewart PLLC

(57) ABSTRACT

The present disclosure concerns a mounting device for semiconductor packages, and a heat dissipation assembly with such a mounting device. The mounting device includes a bottom side comprising one or more cavities to house semiconductor packages, and a top side comprising a plurality of holes extending from the bottom side to the top side for accommodating contact pins of the semiconductor packages. A fixation mechanism fixes the mounting device to a heat dissipation structure.

12 Claims, 6 Drawing Sheets

MOUNTING DEVICES FOR SEMICONDUCTOR PACKAGES WITH A FIXATION MECHANISM

CROSS-REFERENCE TO RELATED APPLICATION

This application claims priority to European Application No. EP 19382173.3 filed Mar. 8, 2019, the contents of which are hereby incorporated by reference in its entirety.

TECHNICAL FIELD

The present invention refers to mounting devices for semiconductor packages.

BACKGROUND

Semiconductor packages are commonly utilized in electronic circuit applications. One common semiconductor device package arrangement when conducted heat dissipation is necessary, includes a substrate that acts as a heat sink and enclosure that can be placed over the substrate so as to form an internal cavity over the substrate. Integrated circuits, such as semiconductor chips, as well as other electrical components, may be placed within the cavity and electrically connected to conductive leads/contact pins that extend out from the enclosure. The conductive leads enable electrical connection between the package and a receptacle, such as a printed circuit board (PCB). Thus, the packaged arrangement allows for easy electrical connection between the circuits to external devices while simultaneously protecting the semiconductor chip and electrical connections from damaging environmental conditions, such as moisture, particles, etc.

Current mounting devices may provide an irregular clamping at difference temperatures and require the use of different materials with an increase of costs. Furthermore, they do not provide proper alignment of the semiconductor packages and contact pins onto the PCB. Temperature changes and peak temperatures suffered by the semiconductor packages can affect the speed, power, and reliability of the system. In this regard, conventional mounting devices as e.g. steel clips are simple mechanical devices that obstruct access for temperature supervision in the semiconductor packages.

For at least these reasons, it is desired a mounting device that permits a simplified assembly with reduced cost materials, that provide alignment of position for various semiconductor packages and their contact pins, that guarantees a good clamping response in a large range of temperatures and that is able to provide access for temperature supervision.

SUMMARY

In a first aspect, it is proposed a mounting device for heat-generating semiconductor packages. The device comprises a bottom side comprising one or more cavities to house semiconductor packages. A top side comprising a plurality of holes extending from the bottom side to the top side for accommodating contact pins of the semiconductor package and fixation means to fix the mounting device housing the semiconductor packages to a heat dissipation structure.

In some examples, each cavity in the bottom side of the mounting device comprises at least one protrusion or bulge to fix the semiconductor package and improve contact of the semiconductor package with a heat dissipation structure, as e.g. a heatsink or cold-plate. In some examples, a thermal pad can be interposed between the heat dissipation structure and the mounting device for thermal coupling. Furthermore, the protrusion presses the semiconductor package against the thermal pad and the heat dissipation structure to increase thermal coupling. At least one protrusion or bulge may be integrally formed by the mounting device, in particular integrally formed by the bottom side of the mounting device. All protrusions or bulges may be integrally formed by the mounting device, in particular integrally formed by the bottom side of the mounting device. Thus, separate pressing means are not required resulting in a reduction of production steps and production costs.

In some examples, the fixations means comprise screw holes adapted to receive fixation screws. In some examples, the top side further comprises one or more alignment pins. In other examples, the top side further comprises one or more openings to allocate structure mounted temperature sensors. These openings allow for thermal measurements direct onto the semiconductor package. In particular, these openings provide an access to the surface of the power electronic components for temperature measurements. Thus, the temperature sensors allocated in the openings may perform a direct temperature measurement of the semiconductor package and/or a direct temperature measurement of the power electronic components. This is a very important difference in comparison to measure with a thermistor fixed on the heatsink. Since a direct measurement of the temperature of the semiconductor package and/or of the power electronic components is not influenced by defects or degradation of thermal interfaces and/or by the inert of the heatsink, the temperature measurement of the critical component is more reliably. Any defects or degradation of thermal interface and the avoidance of the inert of the heatsink are solved by measure direct on the critical component. The openings may be formed by a cavity of the mounting device.

In some examples, the device is made of a resistant low creep plastic material that causes permanent pressure of the power electronic components. In some examples, the low creep plastic material is a selection from preferably Polyphthalamide (PPA), Polyphenylene sulfide (PPS) and Polietereteretoná (PEEK). The mounting device made of a resistant low creep plastic material with at least one protrusion or bulge, in particular with at least one protrusion or bulge having a special geometric design and/or having an optimized geometric design and/or having an adapted geometric design with reference to the power electronic components, may provide an elastic clamp force by the protrusion or bulge without using any metal claws. Thus, protrusion and low creep plastic together with the special geometric design provides an elastic clamp force without using any metal claws. This is an advantage especially in modern high voltage electronic design for e-mobility, where 400-800 Vdc is used, since metal infringes creep/clearance distances. The mounting device made of a resistant low creep plastic material may be formed as a single-piece and/or one-piece mounting device. Thus, there are cost advantages both for the reason with only one plastic mounting device and lower assembly costs. Moreover, at least one protrusion or bulge made of a resistant low creep plastic material may provide an insulation, in particular a fully insulation or partial insulation, of the power electronic components.

In some examples, the bottom side comprises two cavities as shown in FIG. 3 to house two semiconductor packages or six cavities as shown in FIG. 2 to house six semiconductor packages.

In a second aspect, it is proposed a heat dissipation assembly for semiconductor packages, the assembly comprising a printed circuit board, PCB, a heat dissipation structure and a mounting device for housing heat-generating semiconductor packages according to the first aspect of the present invention. The mounting device may be sandwiched between the PCB and the heat dissipation structure. The device can be fixed to the heat dissipation structure via the fixation means. The contact pins of the semiconductor packages may extend through the PCB permitting accessing those contact pins via the PCB.

The heat dissipation assembly can further comprise a thermal pad or layer of thermal interface material (TIM) interposed between the mounting device and the heat dissipation structure to enhance thermal coupling. In some examples, the heat dissipation structure is a heatsink. In other examples, the heat dissipation structure is a cold-plate or a part chassis. The assembly also comprises TIM layers in the one or more openings and interposed between the semiconductor packages and the structure mounted temperature sensors for thermal coupling.

Hence, the proposed mounting devices can maintain a permanent clamp force between −40 to 150° C. and they can improve clearance and creepage distances for applied high voltages such as e.g. 400 or 800 Vdc in e-vehicles. Furthermore, the proposed heat dissipation assembly eases alignment of component packages and contact pins with the PCB. Moreover, the proposed mounting devices reduce assembly and material costs and permit accessing structure mounted temperature sensors via the PCB for direct monitoring of the packages temperature.

BRIEF DESCRIPTION OF THE DRAWINGS

For a better understanding the above explanation and for the sole purpose of providing an example, some non-limiting drawings are included that schematically depict a practical embodiment.

DETAILED DESCRIPTION

Figure 1A:
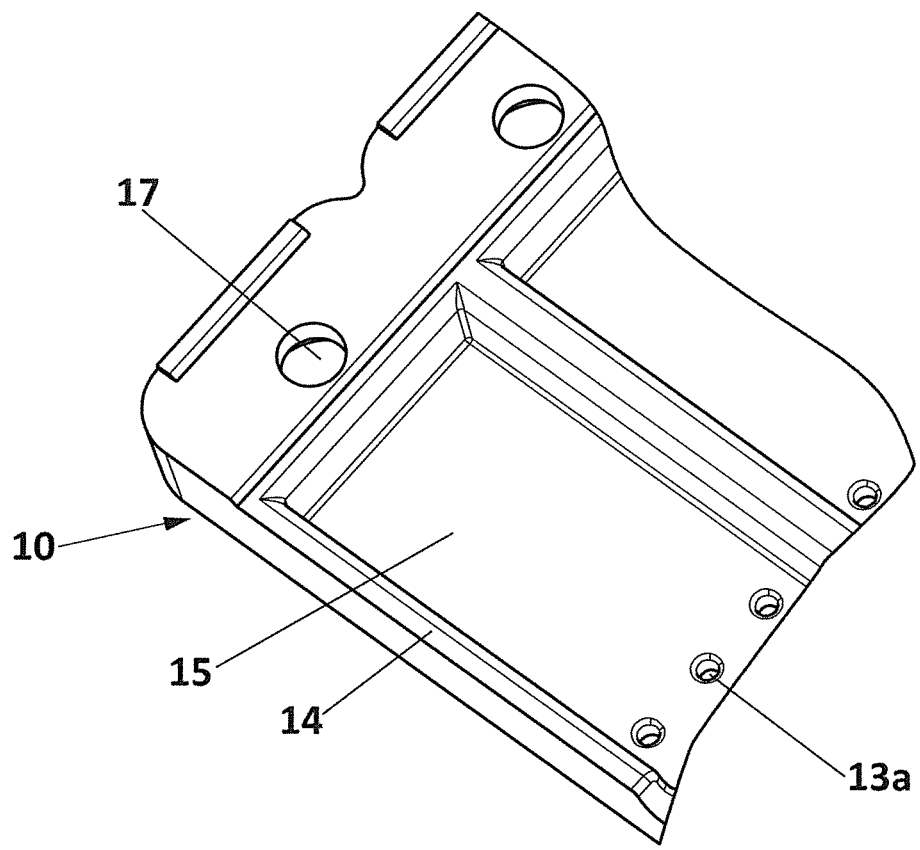
FIG. 1A shows a bottom view of a first example of mounting device according to the present invention.
Figure 1B:
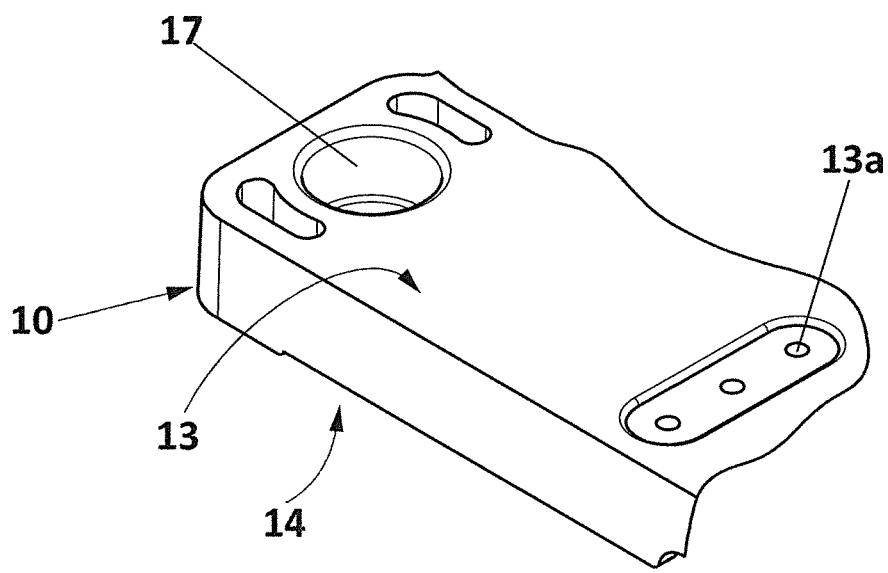
FIG. 1B shows a top view of the first example of mounting device according to the present invention.

FIG. 1A shows a bottom view of an example of a mounting device (10) for heat-generating semiconductor packages, the mounting device (10) comprises a bottom side (14) comprising one or more cavities (15) each for housing a semiconductor package not shown in the figure. Examples of semiconductor packages are e.g. TO220 package and TO247 package. The mounting device (10) comprises a top side (13) shown in FIG. 1B. The top side (13) comprises a plurality of holes (13a) to permit the contact pins (12) of the semiconductor package (11) to extend from the bottom side (14) to the top side (13) of the device (10). Furthermore, the mounting device (10) comprises fixation means comprising screw holes (17) adapted to receive fixation screws to fix the mounting device (10) with the semiconductor packages to a heat dissipation structure.

In some examples, the heat dissipation structure can be a heatsink or a cold-plate or a part chassis.

Figure 2A:
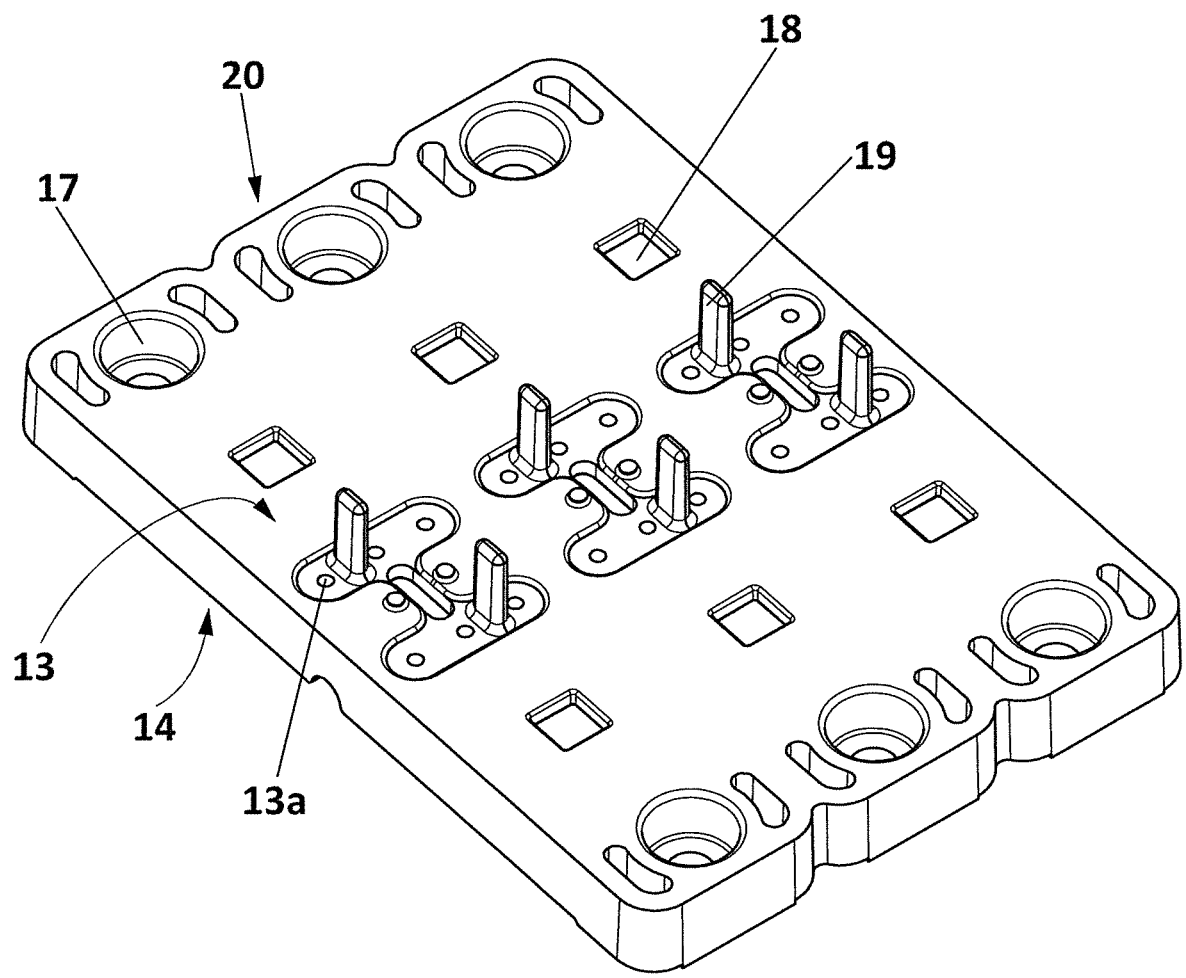
FIG. 2A shows a top view of a second example of mounting device according to the present invention.
Figure 2B:
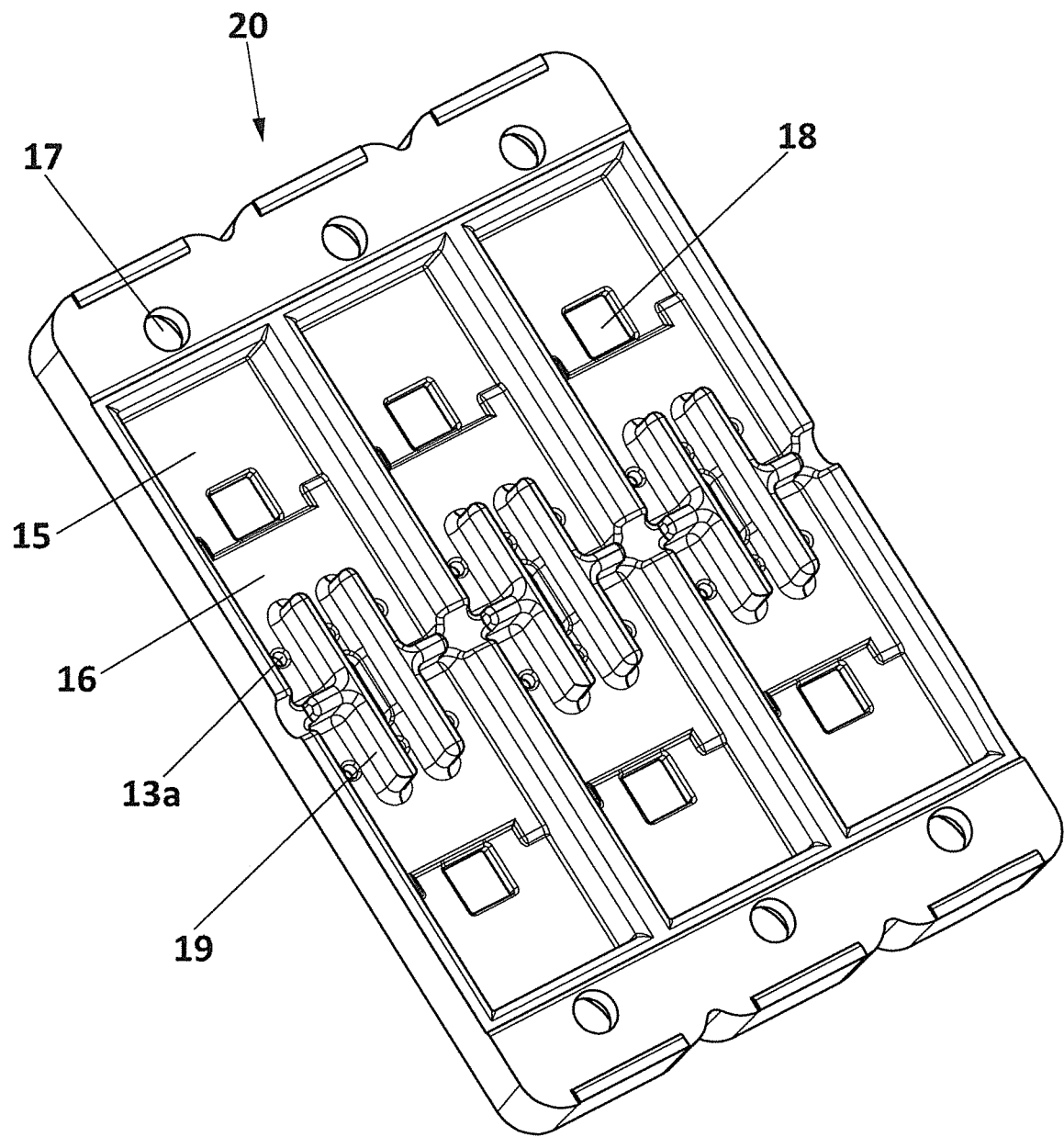
FIG. 2B shows a bottom view of the second example of mounting device according to the present invention.

FIG. 2A shows a top view of another example of a mounting device (20) for heat-generating semiconductor packages according to the present invention. The mounting device (20) comprises a top side (13) and a bottom side (14). The mounting device (10) comprises six cavities (15) for housing six semiconductor packages as shown in FIG. 2B. The top side (13) further comprises one or more alignment pins and the plurality of holes (13a) to permit the contact pins (12) of the semiconductor package (11) to extend from the bottom side (14) to the top side (13).

In particular, the mounting device (20) comprises six alignment pins (19) that permit the alignment of the mounting device (20) with a PCB. Furthermore, the top side (13) further comprises six openings (18) to allocate structure mounted temperature sensors (18a) that supervise and monitor temperature of the semiconductor packages housed in the mounting device (20).

FIG. 2B shows a bottom view of the mounting device (20). This mounting device further comprises a protrusion or bulge (16) formed in each cavity (15) to fix the semiconductor package (11). The protrusion (16) presses the semiconductor package against a heat dissipation structure, avoiding displacement of the semiconductor package and hence, assuring fixation and contact with the structure and increasing thermal coupling. FIG. 2B also shows the bottom side of the six alignment pins (19) and the plurality of holes (13a) that permit the contact pins (12) of the semiconductor package (11) to extend from the bottom side (14) to the top side (13) and the six openings (18) to allocate structure mounted temperature sensors (18a).

Figure 3:
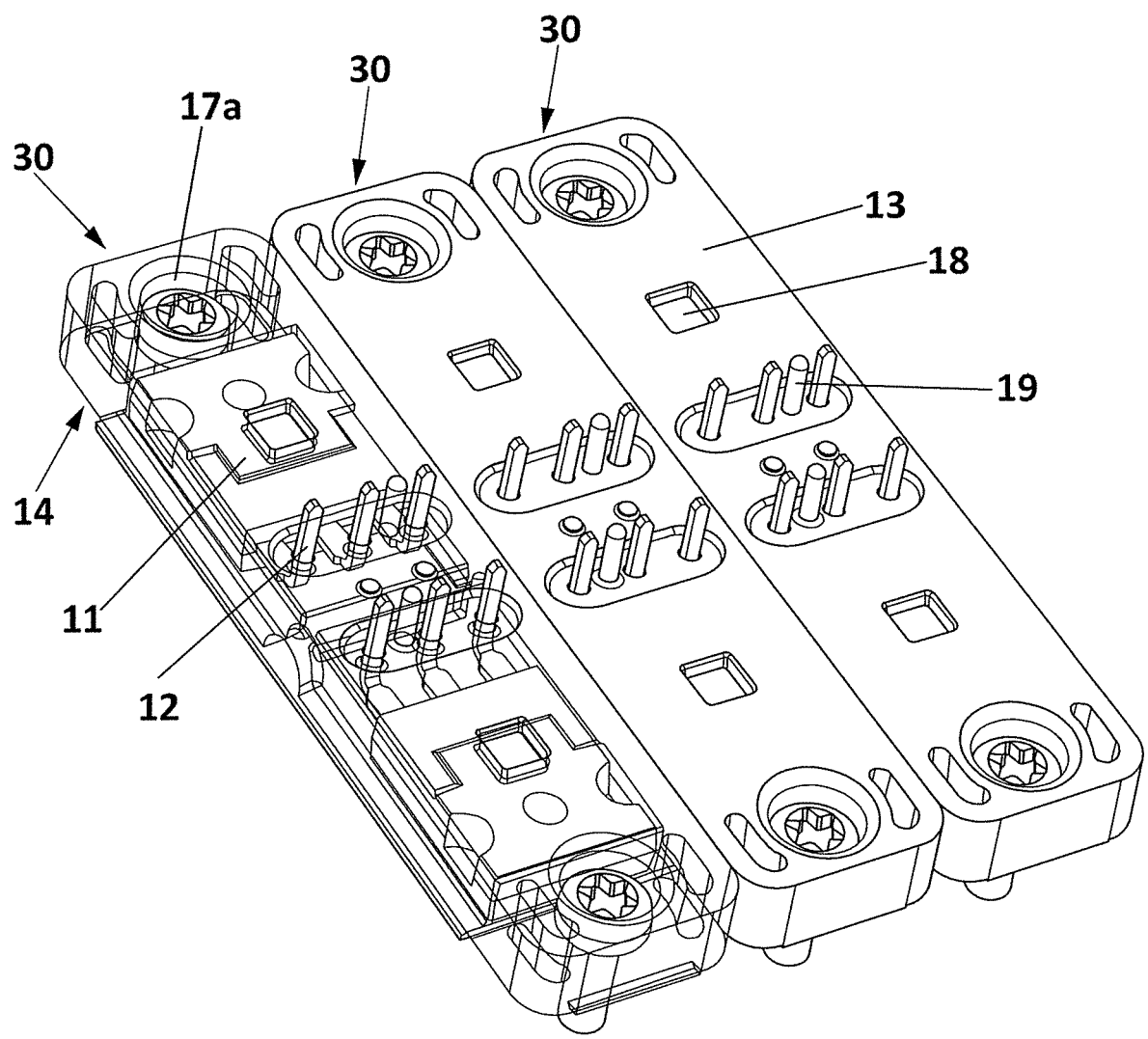
FIG. 3 shows a top view of the second example of mounting device housing semiconductor packages.

FIG. 3 shows another example of a mounting device (30) for two semiconductor packages. In particular, FIG. 3 shows three mounting devices (30) established in series. Each of the mounting devices (30) comprises two cavities (15) for housing two semiconductor packages (11) comprising contacting pins (12). FIG. 3 also shows screws (17a) for fixing the mounting devices (30) with the screw holes (17) to a heat dissipation structure and alignment pins (19) to align the mounting devices (30) with a PCB. Each mounting device (30) comprises two openings (18) to allocate two structure mounted temperature sensors (18a).

Figure 4:
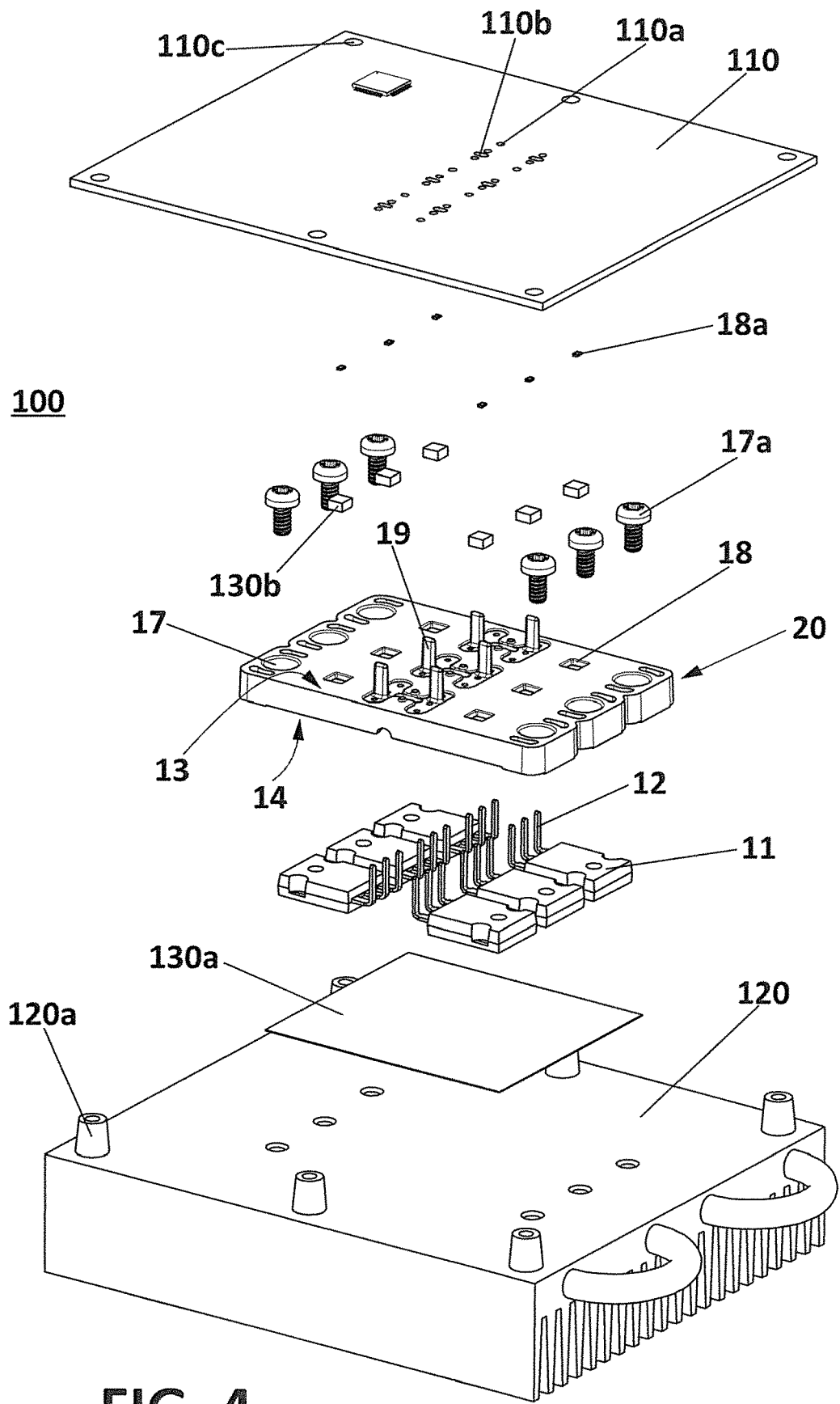
FIG. 4 shows an exploded view of an example of heat dissipation assembly with according to the present invention.

FIG. 4 shows a heat dissipation assembly (100) for heat-generating semiconductor packages (11). The assembly comprises a printed circuit board, PCB (110), a heat dissipation structure (120), and a mounting device (20) as shown in FIGS. 2A and 2B. In this particular example, the mounting device (20) for housing heat-generating semiconductor packages (11) is fixed to a heat dissipation structure which is a heatsink (120). In other examples, the mounting structure can be a cold-plate or a part chassis.

Additionally, a layer of thermal interface material, TIM (130a) is interposed between the device (30) and the heatsink (120) to enhance thermal coupling between the semiconductor packages (11) and the heatsink (120). It can be seen that the device (30) housing six semiconductor packages (11) having contact pins (12) is sandwiched between the PCB (110) and the heatsink (120).

The PCB (110) comprises a set of contact or soldering holes (110a) and a PCB set of holes (110b) an IC (only for illustrative purposes) and screw holes (110c). The device (10) is fixed to the heatsink (120) with the screw holes (17) and screws (17a) and the PCB is fixed with heatsink (120) via the screw holes (110c) and (120a), respectively.

First the alignment pins (19) extend through the PCB set of holes (110b), thus causing alignment for the semiconductor packages (11) contact pins (12) to extend through the set of contact or soldering holes (110a) of the PCB (110).

Furthermore, the heat dissipation assembly (100) heat-generating semiconductor packages further comprises six TIM layers (130b) allocated in the six openings (18). The six TIM layers (130b) are interposed between the semiconductor packages (11) and the structure mounted temperature sensors (18a) and can enhance thermal coupling between the semiconductor packages (11) and the structure mounted temperature sensors (18a).

Figure 5:
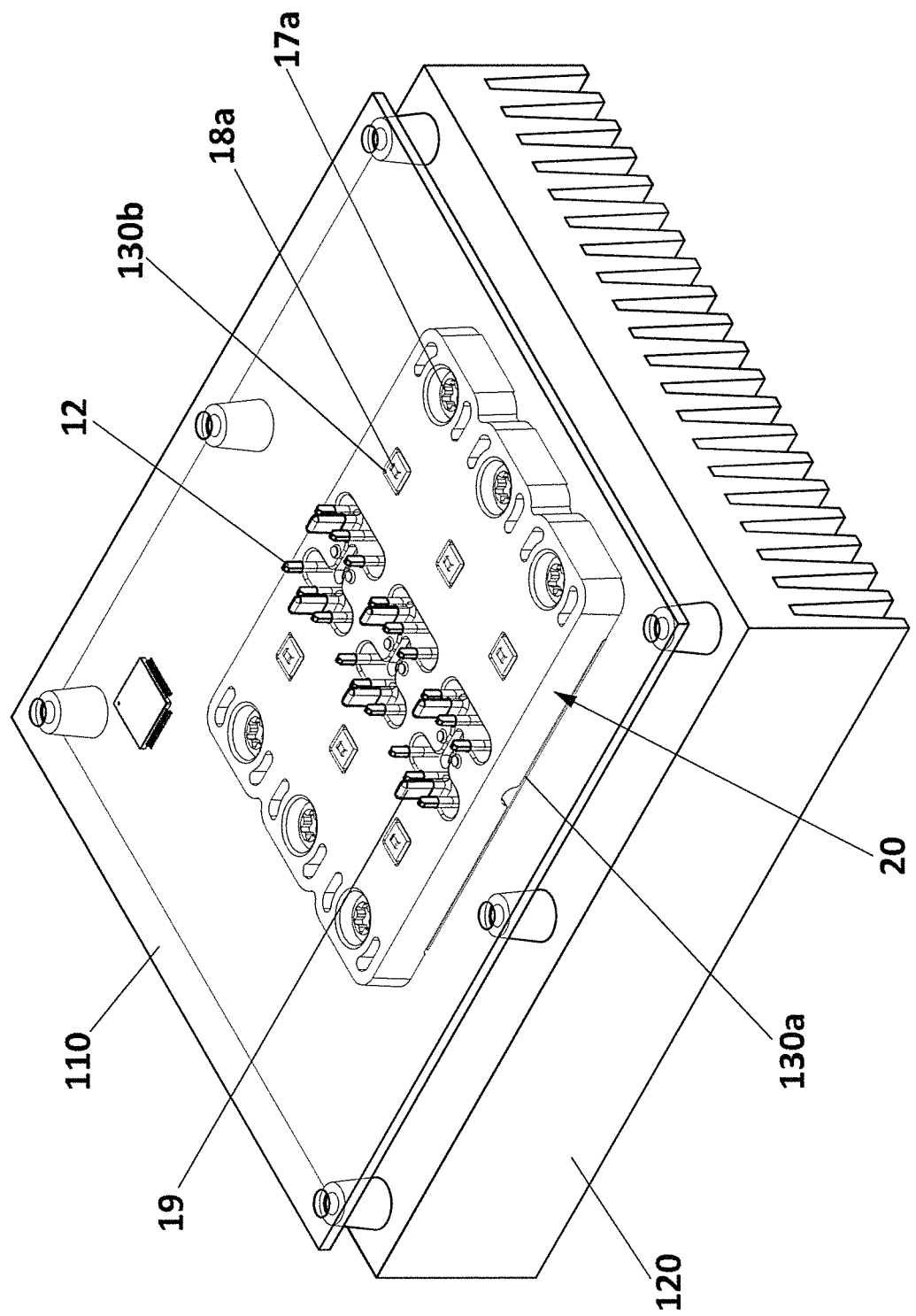
FIG. 5 shows a top view of the heat dissipation assembly.

FIG. 5 shows the mounted heat dissipation assembly (100) for heat-generating semiconductor packages. The assembly (100) comprises the heat-sink (120) the mounting device (30) with contact pins (12) and alignment pins (19) extending through the PCB set of holes (110b) causing the alignment of the contact pins (12) to extend through the set of contact or soldering holes (110a), and the structure mounted temperature sensors (18a), respectively and the PCB and the TIM (130a) interposed between the device (30) and the heatsink (120) and the TIM layers (130b) allocated in the six openings (18). The mounting devices assures fixation of the semiconductor packages on the heat-sink (120) and permits accessing the contacts pins (12) from the PCB (110).

Even though reference has been made to a specific embodiment of the invention, it is obvious for a person skilled in the art that the mounting device and assembly described herein is susceptible to numerous variations and modifications, and that all of the details mentioned can be substituted for other technically equivalent ones without departing from the scope of protection defined by the attached claims.

The invention claimed is:

1. A heat dissipation assembly, comprising:
   a printed circuit board;
   a heat dissipation structure;
   a mounting device for housing semiconductor packages sandwiched between the printed circuit board and the heat dissipation structure;
   the mounting device including a bottom side comprising at least one cavity, structured and arranged to house the semiconductor packages, and a top side comprising a plurality of holes extending from the bottom side to the top side that accommodate contact pins of the semiconductor packages;
   wherein the mounting device is fixed to the heat dissipation structure via a fastener;
   wherein the contact pins of the semiconductor packages extend through the printed circuit board; and
   wherein the top side further includes one or more openings that receive at least one structure mounted temperature sensor, the one or more openings providing access to a surface of at least one of the semiconductor packages disposed on the bottom side for direct temperature measurements of the at least one semiconductor package.

2. The assembly according to claim 1, further comprising a layer of thermal interface material interposed between the mounting device and the heat dissipation structure.

3. The assembly according to claim 1, further comprising a plurality of thermal interface material layers respectively interposed between the semiconductor packages and a respective structure mounted temperature sensor disposed in the one or more openings of the top side.

4. The assembly according to claim 1, wherein the heat dissipation structure is a heatsink, a cold-plate, or a chassis part.

5. The assembly according to claim 1, wherein the bottom side further includes at least one protrusion, structured and arranged to fix at least one of the semiconductor packages.

6. The assembly according to claim 1, wherein the fastener comprises screw holes that receive screws to fix the bottom side of the mounting device to the heat dissipation structure.

7. The assembly according to claim 1, wherein the top side further includes one or more alignment pins.

8. The assembly according to claim 5, wherein the at least one protrusion is disposed in the at least one cavity.

9. The assembly according to claim 1, wherein the mounting device is composed of a low creep plastic material.

10. A mounting device for semiconductor packages, comprising:
    a bottom side comprising at least one cavity, structured and arranged to house at least one semiconductor package;
    a top side comprising a plurality of holes extending from the bottom side to the top side, structured and arranged to accommodate contact pins of the at least one semiconductor package;
    a fastener provided to fix the bottom side that houses the at least one semiconductor package to a heat dissipation structure; and
    wherein the bottom side includes at least one protrusion disposed in the at least one cavity, structured and arranged to fix the at least one semiconductor package; and
    wherein the top side further includes one or more openings that receive at least one structure mounted temperature sensor, the one or more openings providing access to a surface of the at least one semiconductor package disposed on the bottom side for direct temperature measurements of the at least one semiconductor package.

11. The mounting device according to claim 10, wherein the fastener comprises screw holes disposed on the bottom side.

12. The mounting device according to claim 10, wherein the top side includes at least one alignment pin.

* * * * *